US008947135B2

(12) United States Patent
Itonaga

(10) Patent No.: US 8,947,135 B2
(45) Date of Patent: Feb. 3, 2015

(54) OUTPUT CIRCUIT AND VOLTAGE SIGNAL OUTPUT METHOD

(71) Applicant: Fujitsu Semiconductor Limited, Yokohama-shi, Kanagawa (JP)

(72) Inventor: Yuichi Itonaga, Obu (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 14/243,699

(22) Filed: Apr. 2, 2014

(65) Prior Publication Data

US 2014/0333370 A1 Nov. 13, 2014

(30) Foreign Application Priority Data

May 10, 2013 (JP) ................................ 2013-100017

(51) Int. Cl.
*H03K 3/00* (2006.01)
*G05F 1/10* (2006.01)

(52) U.S. Cl.
CPC ........................................ *G05F 1/10* (2013.01)
USPC .......................................................... 327/112

(58) Field of Classification Search
USPC .......................................................... 327/112
See application file for complete search history.

(56) References Cited

U.S. PATENT DOCUMENTS

2001/0054886 A1 12/2001 Takahashi et al.
2009/0225206 A1 9/2009 Oike et al.
2009/0261865 A1 * 10/2009 Pasqualini .................... 327/108
2011/0291733 A1 12/2011 Yano

FOREIGN PATENT DOCUMENTS

JP 2002-009608 A 1/2002
JP 2009-218680 A 9/2009
JP 2011-250345 A 12/2011

* cited by examiner

*Primary Examiner* — Daniel Rojas
(74) *Attorney, Agent, or Firm* — Arent Fox LLP

(57) ABSTRACT

An output circuit includes: a first PMOS transistor and a second PMOS transistor connected in series between a high potential side power supply and an output node;

a first NMOS transistor and a second NMOS transistor connected in series between a low potential side power supply and the output node; a bias voltage generation circuit outputting a first bias voltage to a first bias node connected to a gate terminal of the second PMOS transistor and a second bias voltage to a second bias node connected to a gate terminal of the second NMOS transistor; first and second bias voltage stabilization circuits suppressing fluctuations in the first and second bias voltages; and a control circuit detecting a change in a signal that fluctuates the first bias voltage and the second bias voltage and controlling the first and second bias voltage stabilization circuits.

11 Claims, 6 Drawing Sheets

OUTPUT CIRCUIT AND VOLTAGE SIGNAL OUTPUT METHOD

CROSS-REFERENCE TO RELATED APPLICATION

This application is based upon and claims the benefit of priority of the prior Japanese Patent Application No. 2013-100017, filed on May 10, 2013, the entire contents of which are incorporated herein by reference.

FIELD

The disclosed technique relates to a high voltage output circuit formed by low withstand voltage transistors and a voltage signal output method.

BACKGROUND

In recent years, in a semiconductor device, as the speed of an interface (I/F) part is increased and the voltage thereof is reduced, the transistor manufactured in the advanced technology process tends to reduce the voltage that the transistor can handle. However, the majority of interfaces manufactured based on standards not belonging to advanced technology require high voltages. Accordingly, a high voltage output is produced using an output circuit formed by low withstand voltage transistors manufactured in advanced technology process, and in this case, a state where the withstand voltage is not sufficient is brought about.

Consequently, a high voltage output circuit is formed using low withstand voltage transistors by cascode-connecting the low withstand voltage transistors to disperse the voltage applied to the transistors. In such an output circuit, a drive signal the level of which is shifted is applied to the gates of a part of the transistors and at the same time, a bias voltage is applied to the gates of the other transistors.

In the output circuit, the drive signal and noise from the output node affect the bias voltage and fluctuate the bias voltage. If the bias voltage fluctuates, there is a case where the voltage applied to the transistor exceeds the withstand voltage, and therefore, the transistor is destroyed.

In the case where a high frequency operation is performed in such an output circuit, the device size of PMOS transistors and NMOS transistors that appears when viewed from the output terminal is increased. Accordingly, the capacitance between the gate and drain of the transistor also increases and the AC fluctuation component at the output terminal largely affects the node of the bias voltage via the capacitance. Because of this, the bias voltage fluctuates and if the fluctuations are large, it is no longer possible to guarantee the withstand voltage.

Consequently, a bypass capacitor is connected between the signal line of the bias voltage and a reference voltage source (GND) and thereby the fluctuations in the bias voltage due to noise are suppressed. However, in general, the capacitor used within LSI increases the size of the LSI, and therefore, if a large-sized capacity is provided, the size of LSI is increased and if the size of the capacitor is reduced, the capacitance is reduced, and therefore it is not possible to sufficiently reduce noise.

RELATED DOCUMENTS

[Patent Document 1] Japanese Laid Open Patent Document No. 2009-218680

[Patent Document 2] Japanese Laid Open Patent Document No. 2011-250345

[Patent Document 3] Japanese Laid Open Patent Document No. 2002-009608

SUMMARY

According to a first aspect of the embodiments, an output circuit includes: a first PMOS transistor and a second PMOS transistor connected in series between a high potential side power supply and an output node, the first PMOS transistor being connected to the side of the high potential side power supply and the second PMOS transistor being connected to the output node side; a first NMOS transistor and a second NMOS transistor connected in series between a low potential side power supply and the output node, the first NMOS transistor being connected to the side of the low potential side power supply and the second NMOS transistor being connected to the output node side; a bias voltage generation circuit configured to output a first bias voltage to a first bias node connected to a gate terminal of the second PMOS transistor and to output a second bias voltage to a second bias node connected to a gate terminal of the second NMOS transistor; a first bias voltage stabilization circuit connected to the first bias node and configured to suppress fluctuations in the first bias voltage; a second bias voltage stabilization circuit connected to the second bias node and configured to suppress fluctuations in the second bias voltage; and a control circuit configured to detect a change in a signal that fluctuates the first bias voltage and the second bias voltage and to control the operation of the first bias voltage stabilization circuit and the second bias voltage stabilization circuit.

According to a second aspect of the embodiments, a voltage signal output method for outputting a signal having an amplitude equal to or greater than a withstand voltage of a transistor by applying a first bias voltage to the gate of one PMOS transistor of two PMOS transistors and two NMOS transistors cascode-connected, by applying a second bias voltage to the gate of one of the NMOS transistors, and applying an output signal to the gates of the other one PMOS transistor and the other one NMOS transistor, the method includes: detecting a change in signal that fluctuates the first bias voltage and the second bias voltage and generating a first control signal and a second control signal; and making temporarily active a first bias voltage stabilization circuit and a second bias voltage stabilization circuit configured to reduce the impedance between a first bias node that supplies the first bias voltage and a high potential side power supply and the impedance between a second bias node that supplies the second bias voltage and a low potential side power supply in accordance with the first control signal and the second control signal.

The object and advantages of the embodiments will be realized and attained the elements and combination particularly pointed out in the claims.

It is to be understood that both the foregoing general description and the following detailed description are exemplary and explanatory and are not restrictive of the invention.

DESCRIPTION OF EMBODIMENTS

Before explaining the output circuit of the embodiment, a general output circuit formed by low withstand voltage transistors and which outputs a high voltage signal will be explained.

Figure 1:
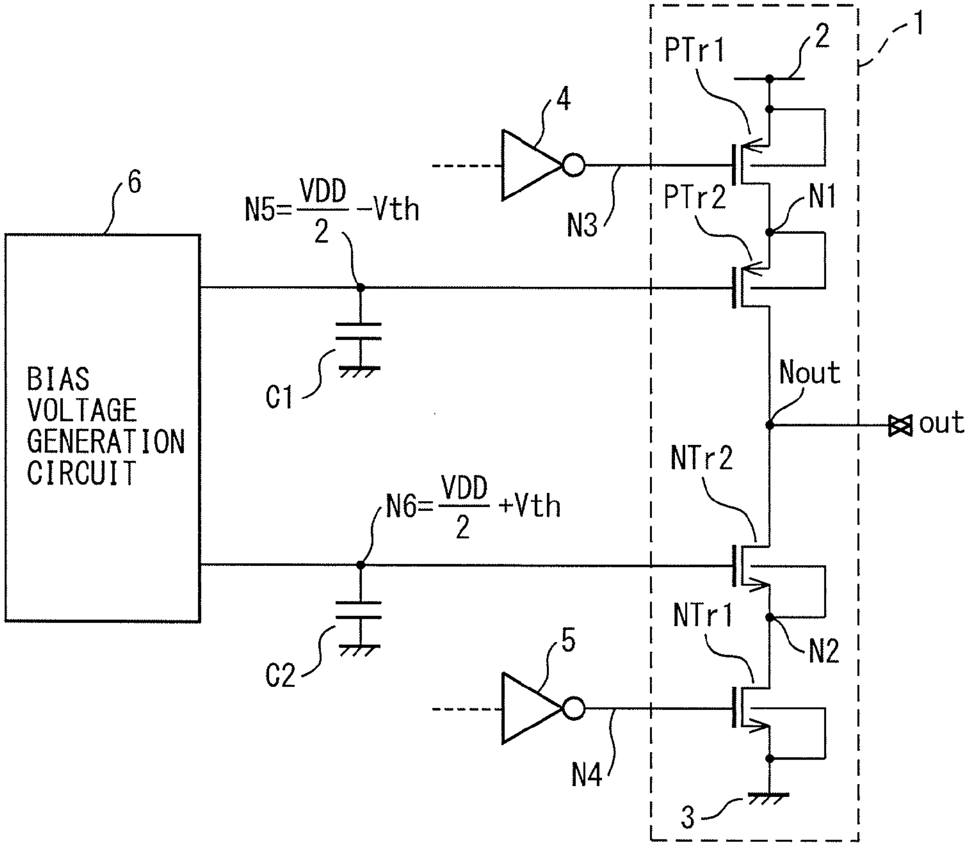
FIG. 1 is a diagram illustrating a configuration of a general output circuit.

FIG. 1 is a diagram illustrating a configuration of a general output circuit.

It is understood that in the circuit in FIG. 1, the limit of the withstand voltage of each transistor is half a power supply voltage VDD (for example, 10 V), i.e., VDD/2+$\alpha$ (for example, 5.5 V) and if a voltage as large as VDD is applied between the drain and source, the transistor is destroyed. A case is considered where the output circuit is configured by a general inverter in which a PMOS transistor (hereinafter, PTr) and an NMOS transistor (hereinafter, NTr) are connected in series between VDD and GND (0 V). In this case, at the time of low (L) level (GND) output, a voltage as large as VDD is applied to PTr and at the time of high (H) level (VDD) output, a voltage as large as VDD is applied to NTr, and each device is destroyed as a result.

Accordingly, the output circuit is formed as illustrated in FIG. 1. The output circuit has an output part 1. The output part 1 has two PTr1 and PTr2 and two NTr1 and NTr2 connected in series between a high potential side power supply terminal 2 and a low potential side power supply terminal 3. Here, the voltage at the high potential side power supply terminal 2 is assumed to be VDD and the voltage at the low potential side power supply terminal 3 is assumed to be 0 V (GND). The substrate of the channel of each transistor is connected to the source. A connection node Nout of PTr2 and NTr2 is connected to an output terminal (node) out. The output terminal out may be a bus terminal. In the case where the output terminal is a bus terminal, an output from the output circuit is also produced, and therefore, in the case where the output terminal (node) is referred to, it is assumed that the output terminal also includes a bus terminal (node).

The gate of PTr1 is connected to an output node N3 of a buffer (inverter) 4 and the gate of NTr1 is connected to an output node N4 of a buffer 5. The buffer 4 performs control so that the voltage of a signal output to the output node N3 changes between VDD/2 and VDD and the buffer 5 performs control so that the voltage of a signal output to the output node N4 changes between GND and VDD/2. In other words, the signals at N3 and N4 are output signals generated in a circuit that uses VDD/2 and GND as a power supply voltage and the levels of which are converted into those between GND and VDD.

The gate of PTr2 and the gate of NTr2 are connected to output bias nodes N5 and N6 of a bias voltage generation circuit 6. The voltage at N5 is Vbiasp=VDD/2−Vth and the voltage at N6 is Vbiasn=VDD/2+Vth. For example, if it is assumed that Vth=0.3 V and VDD/2=5.0 V, then Vbiasp=4.7 V and Vbiasn=5.3 V and PTr2 and NTr2 are in the on state at all times. Due to this, PTr2 fixes the potential at a node N1 to VDD/2, which is raised from Vbiasp by an amount corresponding to Vth. NTr2 fixes the potential at a node N2 to VDD/2, which is reduced from Vbiasn by an amount corresponding to Vth.

At the time of output of Nout=0 V, a voltage of VDD−VDD/2=VDD/2 is applied between the source and drain of PTr1 and a voltage of VDD/2−0 V=VDD/2 is applied between the source and drain of PTr2, both being equal to or less than the withstand voltage. The voltage between the source and the drain of NTr1 and NTr2 is 0 V. At the time of output of Nout=VDD, a voltage of VDD/2−0 V=VDD/2 is applied between the source and drain of NTr 1 and a voltage of VDD−VDD/2=VDD/2 is applied between the source and drain of NTr2, both being equal to or less than the withstand voltage. The voltage between the source and drain of PTr1 and PTr2 is 0V.

As described above, even if a signal that changes between 0 and VDD is output to Nout, it is possible to prevent the withstand voltage of PTr1 and PTr2, and NTr1 and NTr2 of the output part 1 from becoming insufficient.

With regard to the settings of the bias voltage output by the bias voltage generation circuit 6, it is sufficient to appropriately perform settings in accordance with the withstand voltage of the transistor.

In the case where a high frequency operation is performed in the output circuit in FIG. 1, it is desirable to set the device size of PTr2 and NTr2 large that appears when viewed from the output terminal out. Because of this, the capacitance between the gate and drain of the transistor becomes large accompanying this and via the capacitance, the AC fluctuation component at the node Nout propagates to the output bias nodes N5 and N6 at the bias voltage in a magnitude that is too large to be ignored. Due to this, the voltages at N5 and N6 fluctuate and if the fluctuations are large, the potentials at the nodes N1 and N2 also fluctuate and it is no longer possible to guarantee that the voltage applied to the transistors is equal to or less than the withstand voltage.

Consequently, in the circuit in FIG. 1, bypass capacitors C1 and C2 are connected between the output bias nodes N5 and N6, and GND. By providing the bypass capacitors C1 and C2, the amplitude of noise produced at the output bias nodes N5 and N6 is reduced.

The larger the capacitance value, the more the bypass capacitors C1 and C2 reduce the amplitude of noise, however, in general, if the capacitance value of a capacitor provided within LSI is increased, its size is also increased, and therefore, the size impact becomes problematic.

Figure 2:
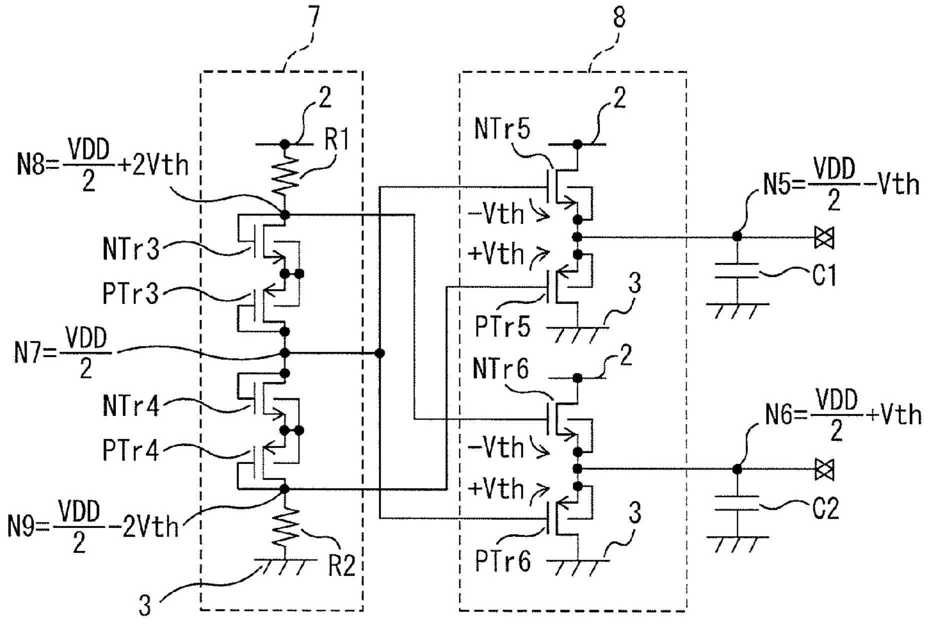
FIG. 2 is a diagram illustrating a circuit configuration of the bias voltage generation circuit illustrated in FIG. 1.

FIG. 2 is a diagram illustrating a circuit configuration of the bias voltage generation circuit 6 illustrated in FIG. 1.

The bias voltage generation circuit 6 has a voltage divider circuit 7 and a bias voltage output circuit 8. The voltage divider circuit 7 has a resistor R1, NTr3, PTr3, NTr4, PTr4, and a resistor R2 connected in series between the high potential side power supply terminal 2 and the low potential side power supply terminal 3. The connection node of R1 and NTr3 is a node N8, the connection node of PTr3 and NTr4 is a node N7, and the connection node of PTr4 and the resistor R2 is a node N9. It is assumed that the resistance value of the resistor R1 and the resistance value of the resistor R2 are equal and the threshold value of the PMOS transistor and that of the NMOS transistor are the same and Vth. The voltage divider circuit 7 outputs a central divided voltage VDD/2 from the node N7, a first divided voltage VDD/2+2Vth from the node N8, and a second divided voltage VDD/2−2Vth from the node N9.

The bias voltage output circuit 8 has a first bias voltage output circuit configured to output a first bias voltage and a second bias voltage output circuit configured to output a second bias voltage. The first bias voltage output circuit has NTr5 and PTr5 connected in series between the high potential side power supply terminal 2 and the low potential side power supply terminal 3. The gate terminal of NTr5 is connected to the node N7 of the voltage divider circuit 7 and the central divided voltage VDD/2 is applied thereto. The gate terminal of PTr5 is connected to the node N9 of the voltage divider circuit 7 and the second divided voltage VDD/2-2Vth is applied thereto. The connection node of NTr5 and PTr5 is connected to the output bias node N5 and outputs the first bias voltage VDD/2−Vth.

The second bias voltage output circuit has NTr6 and PTr6 connected in series between the high potential side power supply terminal 2 and the low potential side power supply terminal 3. The gate terminal of NTr6 is connected to the node N8 of the voltage divider circuit 7 and the first divided voltage VDD/2+2Vth is applied thereto. The gate terminal of PTr6 is connected to the node N7 and the central divided voltage VDD/2 is applied thereto. The connection node of NTr6 and PTr6 is connected to the output bias node N6 and outputs the second bias voltage VDD/2+Vth.

The first and second bias voltage output circuits of the bias voltage generation circuit 6 illustrated in FIG. 2 output bias voltages via the transistors whose drains are grounded, and therefore, spontaneously return to the constant state against fluctuations in voltage at the output bias node. For example, in the case where the output bias node N5 fluctuates in the positive (+) direction, a gate-to-source voltage Vgs temporarily increases in PTr5 and a drain-to-source current Ids increases compared to that in the constant state. This increase in current acts to return the bias node inclined to + to the constant state, and therefore, the operation is to spontaneously return from the fluctuated state. For the change in the negative (−) direction, the action is reversed and the operation is similarly to return fluctuations to the original state. In this manner, the bias voltage output circuit operates to return the fluctuated bias voltage to the original level and thus suppresses fluctuations in the bias voltage.

The force (drive force) acting in the return direction depends on a W/L ratio (W: gate width, L: gate length) of the output transistor and the larger W/L, the stronger the return force against fluctuations, however, there arises such a problem that the constant current increases conversely. Hereinafter, for simplification of explanation, the state where the return force is strong, i.e., W/L is large is expressed by that the bias node impedance is low and the state where the return force is weak, i.e., W/L is small by that the bias node impedance is high.

The return operation described above is triggered by fluctuations of the bias node themselves. Because of this, in the case where the return force is strong, the return operation acts during fluctuations in voltage and the absolute value of fluctuations is reduced, however, when the return force is weak, the return operation is performed after fluctuations expire, and therefore, from the viewpoint of reducing the absolute value of fluctuations, the result is the same as that in the state where no measures are taken.

Figure 3:
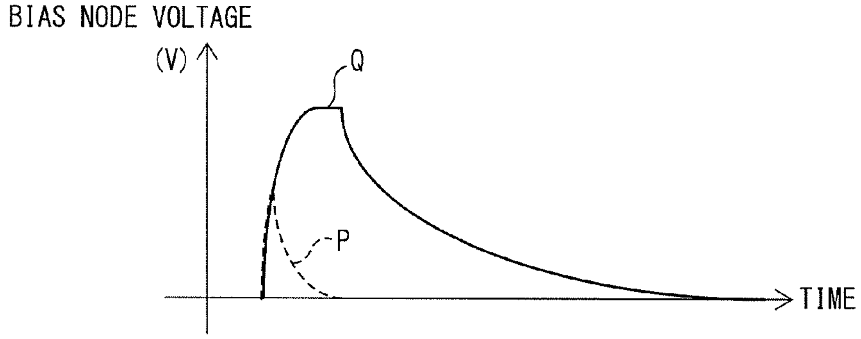
FIG. 3 is a diagram for explaining a reduction in the absolute value of fluctuations due to the difference in the return force in the case where the voltage at the bias node fluctuates due to noise etc. from the output node.

FIG. 3 is a diagram for explaining a reduction in the absolute value of fluctuations due to the difference in the return force in the case where the voltage at the bias node fluctuates due to noise etc. from the output node.

In FIG. 3, a broke line P indicates the voltage fluctuations at the bias node in the case where the return force (drive force) of the bias voltage output circuit is strong and a solid line Q indicates the voltage fluctuations at the bias node in the case where the return force (drive force) is weak.

From the viewpoint of observing the withstand voltage of a device, the absolute value of fluctuations at the bias node is suppressed as much as possible and desirably, the return force (drive force) is strong.

As described previously, in the output circuit in FIG. 1, it is desirable to increase the device size of PTr2 and NTr2 that appears when viewed from the output terminal out in the case where the high frequency operation is performed. However, because of this, the capacitance between the gate and drain of the transistor is also increased accompanying this and the AC fluctuation component at the node Nout propagates to the output bias nodes N5 and N6 of the bias voltage output circuit in a magnitude that is too large to be ignored via the capacitance. Because of this, the voltages at N5 and N6 fluctuate and if the fluctuations are large, the potentials at the nodes N1 and N2 also fluctuate and it is no longer possible to guarantee that the voltage applied to the transistor is equal to or less than the withstand voltage.

In the case where measures against the above-described voltage fluctuations at the bias node are taken in the bias voltage output circuit included in the bias voltage generation circuit, as previously described, the impedance of the bias node is reduced and the voltage fluctuations are caused to cease quickly by sacrificing the constant current. However, at the time of high speed operation, the slew rate of a signal becomes steep, and therefore, the fluctuations at the bias node also become steep, and it is not possible to observe the withstand voltage of the device unless the circuit is caused to perform the return operation quickly so that the return force acts during voltage fluctuations at the bias node. In other words, it is desirable to reduce the bias node impedance by an amount corresponding to the quick return operation at the time of high speed operation. In this case, the constant current increases accompanying the reduction in the bias node impedance, and therefore, it is desirable to suppress the constant current.

Figure 4:
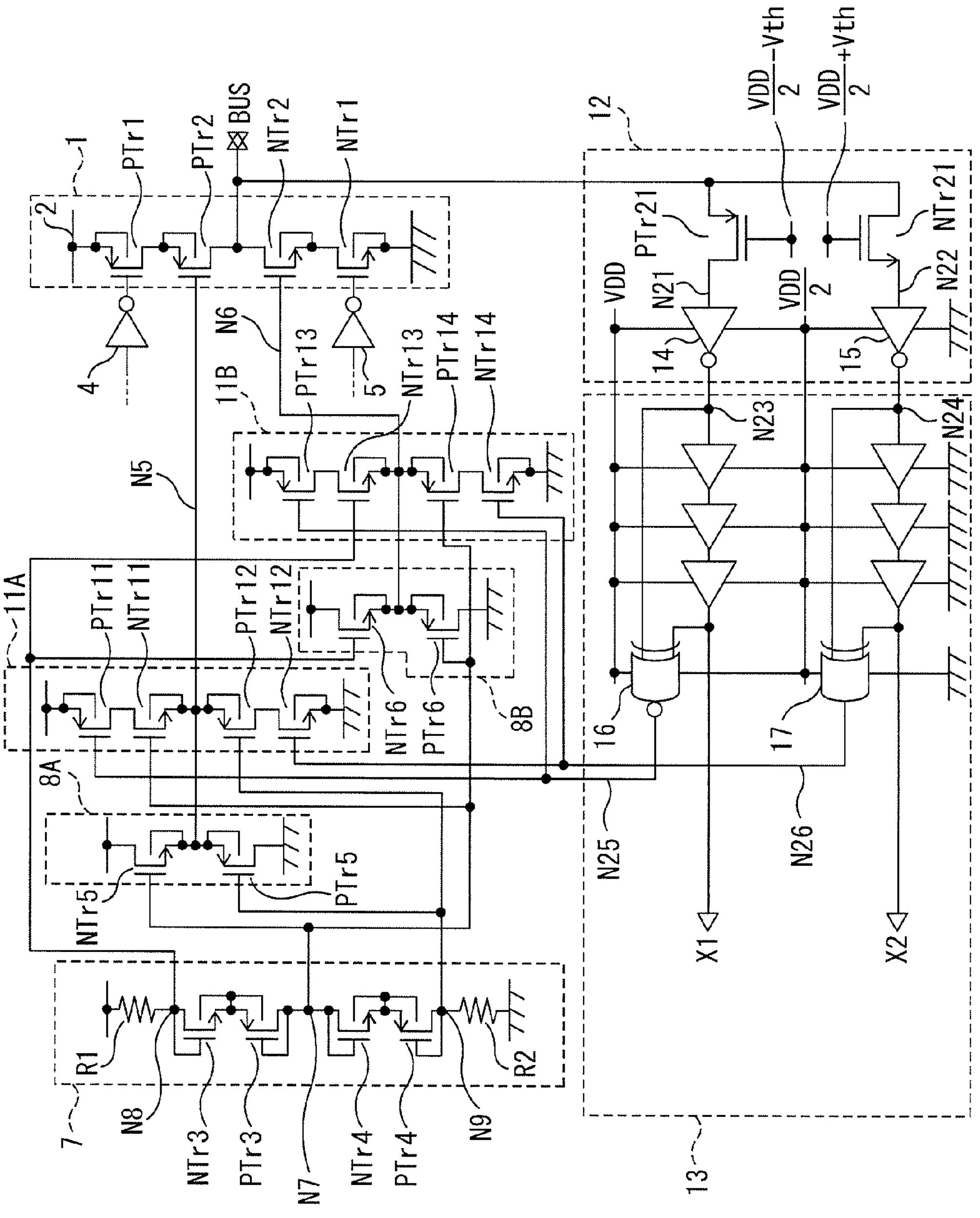
FIG. 4 is a diagram illustrating a configuration of the output circuit of a first embodiment.

FIG. 4 is a diagram illustrating a configuration of the output circuit of a first embodiment.

It is premised that the limit of the withstand voltage of each transistor forming the output circuit of the first embodiment is half the power supply voltage VDD (for example, 10 V), i.e., VDD/2+α (for example, 5.5 V) and if a voltage as large as VDD is applied between the drain and source, the transistor is destroyed.

The output circuit of the first embodiment uses a reentry input of an I/O terminal BUS to detect voltage fluctuations at the terminal BUS.

The output circuit of the first embodiment has the output part 1, the buffers 4 and 5, the voltage divider circuit 7, a first bias voltage output circuit 8A, and a second bias voltage output circuit 8B. The output circuit of the first embodiment further has a first bias voltage stabilization circuit 11A, a second bias voltage stabilization circuit 11B, a reentry input circuit 12, and a control circuit 13. The voltage divider circuit 7, the first bias voltage output circuit 8A, and the second bias voltage output circuit 8B form the bias voltage generation circuit 6.

The output part 1 and the buffers 4 and 5 are the same as those in the output circuit illustrated in FIG. 1 and the connection node of PTr2 and NTr2 of the output part 1 is connected to the I/O bus terminal BUS. The voltage divider circuit 7 is the same as that illustrated in FIG. 2. Explanation of the output part 1, the buffers 4 and 5, and the voltage divider circuit 7 is omitted.

The first bias voltage output circuit 8A and the second bias voltage output circuit 8B keep the bias nodes N5 and N6 at a desired voltage even in the idle state. The first bias voltage output circuit 8A and the second bias voltage output circuit 8B are the same as the first bias voltage output circuit and the second bias voltage output circuit included in the bias voltage output circuit 8 in FIG. 2, however, the difference lies in that the W/L ratio is reduced and the constant current is reduced. Explanation of the specific circuit configuration of the first bias voltage output circuit 8A and the second bias voltage output circuit 8B is omitted.

The first bias voltage stabilization circuit 11A has a PMOS transistor PTr11, an NMOS transistor NTr11, a PMOS transistor PTr12, and an NMOS transistor NTr12. PTr11 and NTr11 are connected in series between the high potential side power supply (VDD) and a terminal connected to the bias node N5, and PTr 11 is connected to VDD and NTr11 is connected to the terminal connected to the bias node N5. NTr12 and PTr12 are connected in series between the low potential side power supply (GND) and the terminal connected to the bias node N5, and NTr12 is connected to GND and PTr12 is connected to the terminal connected to the bias node N5. To the gate of PTr11, a first control signal is applied from the control circuit 13 and to the gate of NTr11, the central divided voltage is applied from the voltage divider circuit 7. To the gate of NTr12, a second control signal from the control circuit 13 is applied and to the gate of PTr12, the third divided voltage is applied from the voltage divider circuit 7.

The second bias voltage stabilization circuit 11B has a PMOS transistor PTr13, an NMOS transistor NTr13, a PMOS transistor PTr14, and an NMOS transistor NTr14. PTr13 and NTr13 are connected in series between VDD and a terminal connected to the bias node N6, and PTr 13 is connected to VDD and NTr13 is connected to the terminal connected to the bias node N6. NTr14 and PTr14 are connected in series between GND and the terminal connected to the bias node N6, and NTr14 is connected to GND and PTr14 is connected to the terminal connected to the bias node N6. To the gate of PTr13, the first control signal is applied from the control circuit 13 and to the gate of NTr13, the first divided voltage is applied from the voltage divider circuit 7. To the gate of NTr14, the second control signal from the control circuit 13 is applied and to the gate of PTr14, the central divided voltage is applied from the voltage divider circuit 7.

The W/L ratio of PTr11, NTr11, PTr12, and NTr12 forming the first bias voltage stabilization circuit 11A is increased and thus the drive force is increased in magnitude. Similarly, the W/L ratio of PTr13, NTr13, PTr14, and NTr14 forming the second bias voltage stabilization circuit 11B is increased and thus the drive force is increased in magnitude.

In the first bias voltage stabilization circuit 11A, when PTr11 is on, the source of NTr11 is connected to the node N5, and therefore, if the voltage at the node N5 is reduced, a power supply is supplied to the node N5 from VDD and thus the reduction in voltage at the node N5 is suppressed. Similarly, when NTr12 is on, the source of PTr12 is connected to the node N5, and therefore, if the voltage at the node N5 is increased, a power supply is supplied to the node N5 from GND and thus the increase in voltage at the node N5 is suppressed. As described above, because the W/L ratio of PTr11, NTr11, PTr12, and NTr12 is large, the return force (drive force) of the first bias voltage stabilization circuit 11A is strong and the voltage fluctuations at the node N5 are suppressed strongly. When PTr11 or NTr12 is off, no constant current flows in the first bias voltage stabilization circuit 11A. As described above, in the first bias voltage stabilization circuit 11A, PTr11 and NTr12 work as a switch in accordance with the first and second control signals and enter the operating state when the first and second control signals are active and stop the operation in other cases.

Similarly, in the second bias voltage stabilization circuit 11B, PTr13 and NTr14 work as a switch. When PTr13 is on, the source of NTr13 is connected to the node N6, and therefore, if the voltage at the node N6 is reduced, a power supply is supplied to the node N6 from VDD and thus the reduction in voltage at the node N6 is suppressed. Similarly, when NTr14 is on, the source of PTr14 is connected to the node N6, and therefore, if the voltage at the node N6 is increased, a power supply is supplied to the node N6 from GND and thus the increase in voltage at the node N6 is suppressed. As described above, because the W/L ratio of PTr13, NTr13, PTr14, and NTr14 is large, the return force (drive force) of the second bias voltage stabilization circuit 11B is strong and the voltage fluctuations at the node N6 are suppressed strongly. When PTr13 or NTr14 is off, no constant current flows in the second bias voltage stabilization circuit 11B. As described above, in the second bias voltage stabilization circuit 11B, PTr13 and NTr14 work as a switch in accordance with the first and second control signals and enter the operating state when the first and second control signals are active and stop the operation in other cases.

The reentry input circuit 12 has two reentry parts, i.e., a first reentry part and a second reentry part using the I/O bus terminal BUS as an input. The first reentry part has a step-down PMOS transistor PTr21 and an inverter 14 that operates on the power supply between VDD/2 and VDD and the threshold voltage of which is set high. To the gate of PTr21, VDD/2−Vth is applied, the source is connected to the I/O bus terminal BUS, and the drain is connected to the input of the inverter 14. The second reentry part has a step-down NMOS transistor NTr21 and an inverter 15 that operates on the power supply between GND and VDD/2 and the threshold voltage of which is set low. To the gate of NTr21, VDD/2+Vth is applied, the source is connected to the I/O bus terminal BUS, and the drain is connected to the input of the inverter 15.

The control circuit 13 has a first control part and a second control part. The first control part has a buffer string including three buffers that operate on the power supply between VDD/2 and VDD and an XNOR gate 16. The buffer string delays the output of the inverter 14. The XNOR gate 16 generates a negation of an exclusive OR of the output of the inverter 14 and the delayed output of the inverter 14 and outputs the negation to a node N25 as the first control signal. The first control signal generated by the first reentry part and the first control part is a signal that becomes active (L level) for a fixed period of time from the instant the reentry signal at the I/O bus terminal BUS changes. The output of the buffer string is output to a reentry core output terminal X1 as a first reentry signal.

The second control part has a buffer string including three buffers that operate on the power supply between GND and VDD/2 and an XOR gate 17. The buffer string delays the output of the inverter 15. The XOR gate 17 generates an exclusive OR of the output of the inverter 15 and the delayed output of the inverter 15 and outputs the exclusive OR to a node N26 as the second control signal. The second control signal generated by the second reentry part and the second control part is a signal that becomes active (H level) for a fixed period of time from the instant the reentry signal at the I/O bus terminal BUS changes. The output of the buffer string is output to a reentry core output terminal X2 as a second reentry signal.

Consequently, the first bias voltage stabilization circuit 11A and the second bias voltage stabilization circuit 11B receive the first and second control signals and enter the operating state for a fixed period of time from the instant the voltage at the I/O bus terminal BUS changes.

Figure 5A:
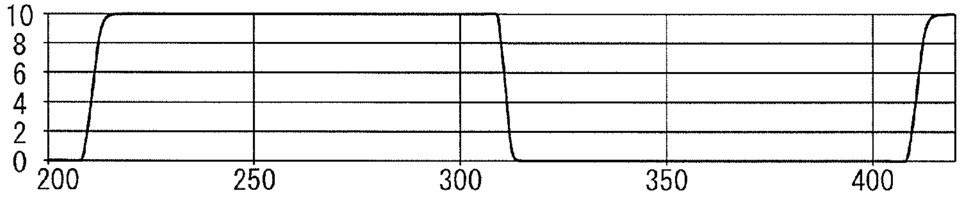
FIG. 5A to FIG. 5E are time charts each illustrating a change in voltage at each part in the case where the signal (voltage) at the I/O bus terminal BUS changes between the low level (GND) and the high level (VDD) in the output circuit of the first embodiment illustrated in FIG. 4.
Figure 5B:
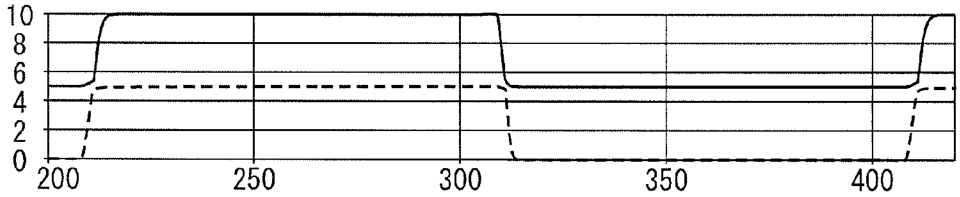
Figure 5C:
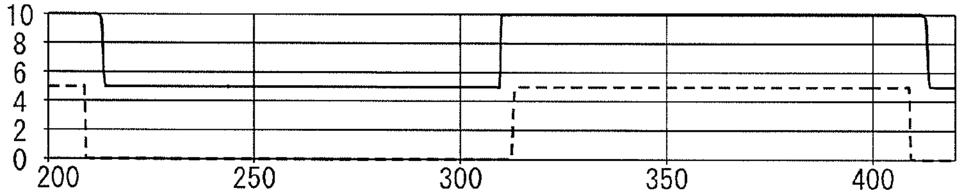
Figure 5D:
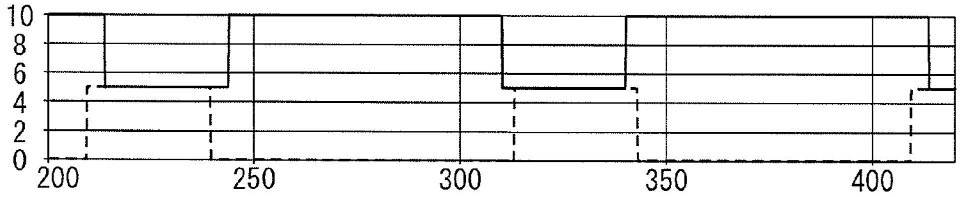
Figure 5E:
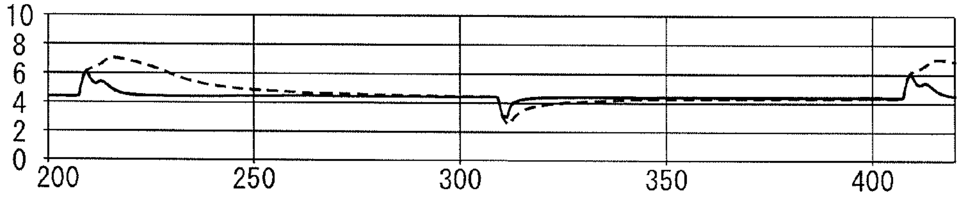

FIG. 5A to FIG. 5E are time charts each illustrating a change in voltage at each part in the case where the signal (voltage) at the I/O bus terminal BUS changes between the low level (GND) and the high level (VDD) in the output circuit of the first embodiment illustrated in FIG. 4. In FIG. 5A to FIG. 5E, the horizontal axis represents time and the vertical axis represents the voltage (V). FIG. 5A illustrates a signal at the terminal BUS. In FIG. 5B, the solid line indicates a signal at N21 and the broken line indicates a signal at N22. In FIG. 5C, the solid line indicates a signal at N23 and the broken line indicates a signal at N24. In FIG. 5D, the solid line indicates a signal at N25 and the broken line indicates a signal at N26. In FIG. 5E, the solid line indicates voltage fluctuations at N5 in the output circuit of the first embodiment and the broken line indicates voltage fluctuations at N5 in the output circuit in FIG. 1 and FIG. 2.

Hereinafter, by taking a rise signal at the I/O bus terminal BUS in FIG. 5A to FIG. 5E as an example, the operation and desirable threshold value of the circuit in FIG. 4 are explained.

As in FIG. 5A, at the time of input or output operation, the terminal BUS changes between 0 V and VDD and the AC fluctuation component propagates as fluctuations in the positive (+) direction to the bias nodes N5 and N6 via the gate-to-drain capacitances of PTr2 and NTr2 on the output circuit.

On the other hand, the signal at the terminal BUS propagates to the reentry input circuit 12 and is output to the node N21 as a voltage signal between VDD/2 and VDD through the step-down device PTr21 and is output to the node N22 as a voltage signal between GND and VDD/2 through the step-down device NTr21. The signal at the node N21 enters the gate of the reentry input initial stage inverter 14 that operates at the same potential and the signal at the node N22 enters the gate of the reentry input initial stage inverter 15 that operates at the same potential, respectively. FIG. 5B illustrates these signals. The inverters 14 and 15 invert and output the respective input signals.

At this time, as illustrated in FIG. 5C, the signal at the terminal BUS has changed from GND to VDD, and therefore, the inverter 15 that operates on a power supply voltage close to GND responds to the fluctuations of the signal at the terminal BUS earlier than the inverter 14. Due to this, the speed of the control processing of the second control part related to the signal path of the power supply between GND and VDD/2 is increased as a result. It is possible to further increase the response speed by setting the threshold voltage of the inverter 15 low. This is also true with the inverter 14 that operates on a voltage close to VDD with regard to the fall signal at the terminal BUS. In this case, by setting the threshold voltage of the inverter 14 somewhat high, the response speed of the subsequent first control part is increased more.

The XNOR 16 outputs the negation of the exclusive OR of the output signal of the inverter 14 (signal at N23) and the delayed signal, which is the output signal of the inverter 14 delayed by a fixed period of time, to N25. The XOR 17 outputs the exclusive OR of the output signal of the inverter 15 (signal at N24) and the delayed signal, which is the output signal of the inverter 15 delayed by a fixed period of time, to N26. FIG. 5D illustrates the first control signal at N25 and the second control signal at N26. The first and second control signals are the operation control signals of the first bias voltage stabilization circuit 11A and the second bias voltage stabilization circuit 11B and supplied to the gates of PTr11 and PTf13, and NTr12 and NTr14.

In response to this, PTr11 and PTr13, and NTr12 and NTr14 become active from when the fluctuation detection signals at the terminal BUS (signals at N23 and N24) are inverted until the output signal of the buffer string is inverted. In other words, PTr11 and PTr13, and NTr12 and NTr14 become active during the period of time corresponding to the delay time of the buffer string. Due to this, fluctuations are caused to cease in an instant by temporarily reducing the impedance between the bias node N5 and the power supply VDD and the impedance between the bias node N6 and GND. Then, after a fixed period of time (delay time), the first and second control signals switch to the inactive (off) state again. Because of this, the operation to stop the current generated in the active state of the first bias voltage stabilization circuit 11A and the second bias voltage stabilization circuit 11B is performed as a result.

As described above, when the fluctuations at the terminal BUS are caused by a rise signal, the signal path (the second reentry input part and the second control part) that operates on the power supply voltage between GND and VDD/2 responds first to the fluctuations. Because of this, the second control signal (signal at N26) of the control signals of the first bias voltage stabilization circuit 11A and the second bias voltage stabilization circuit 11B responds to the fluctuations immediately after the signal at the terminal BUS starts to rise and turns on NTr12 and NTr14. In response to this, the state (active state) is brought about where the drain-grounded circuits by PTr12 and PTr14 operate first. As explained in FIG. 2, the drain-grounded circuits by PTr12 and PTr14 are excellent in the force to return the positive fluctuations at the bias nodes N5 and N6 to the constant state. Because of this, the drain-grounded circuits by PTr12 and PTr14 enter the state where the fluctuations in the positive direction at the bias node caused by the rise signal at the terminal BUS can be addressed quickly.

On the other hand, the first control signal (signal at N25) is generated in the signal path (the first reentry input part and the first control part) that operates on the power supply voltage between VDD/2 and VDD. Because of this, PTr11 and PTr13 turn on slightly delayed with respect to the rise signal at the terminal BUS depending on the slew rate. However, this control is related to the control on the side of the drain-grounded circuits of NTr11 and NTr13 and they are caused only to turn on to take measures against the swinging-back caused by the return from the fluctuations in the positive direction by PTr12 and PTr14. Because of this, even if the control of PTr12 and PTr14 becomes active with a delay after NTr11 and NTr13 become active, no problem in particular occurs.

As described above, even if the first bias voltage stabilization circuit 11A and the second bias voltage stabilization circuit 11B are brought into the operating state (on state) by the series of operations in order to reduce the power supply impedances of the nodes N5 and N6, the result will be that the constant current increases only temporarily. In the manner as described above, the quick recovery from the voltage fluctuations at the bias nodes N5 and N6 is implemented while suppressing the increase in the constant current to the minimum.

The voltage fluctuations at N5 in the output circuit in FIG. 1 and FIG. 2 are as illustrated by the broken line in FIG. 5E, however, the voltage fluctuations at N5 in the output circuit of the first embodiment are as illustrated by the solid line. From this, it is possible to recognize the effect of suppressing the voltage fluctuations at the bias node in the first embodiment.

In the output circuit of the first embodiment, by the addition of the reentry input circuit 12 and the control circuit 13, in particular, by the addition of the step-down devices PTr21 and NTr21, a parasitic capacitance is added to the terminal BUS. There is a possibility that the addition of the parasitic capacitance affects the high-speed operation, however, the parasitic capacitance caused by the addition of the step-down devices is about tens of fF at the most, and therefore, the I/O input/output operation at about several hundreds MHz is substantially not affected and no problem will arise.

Figure 6:
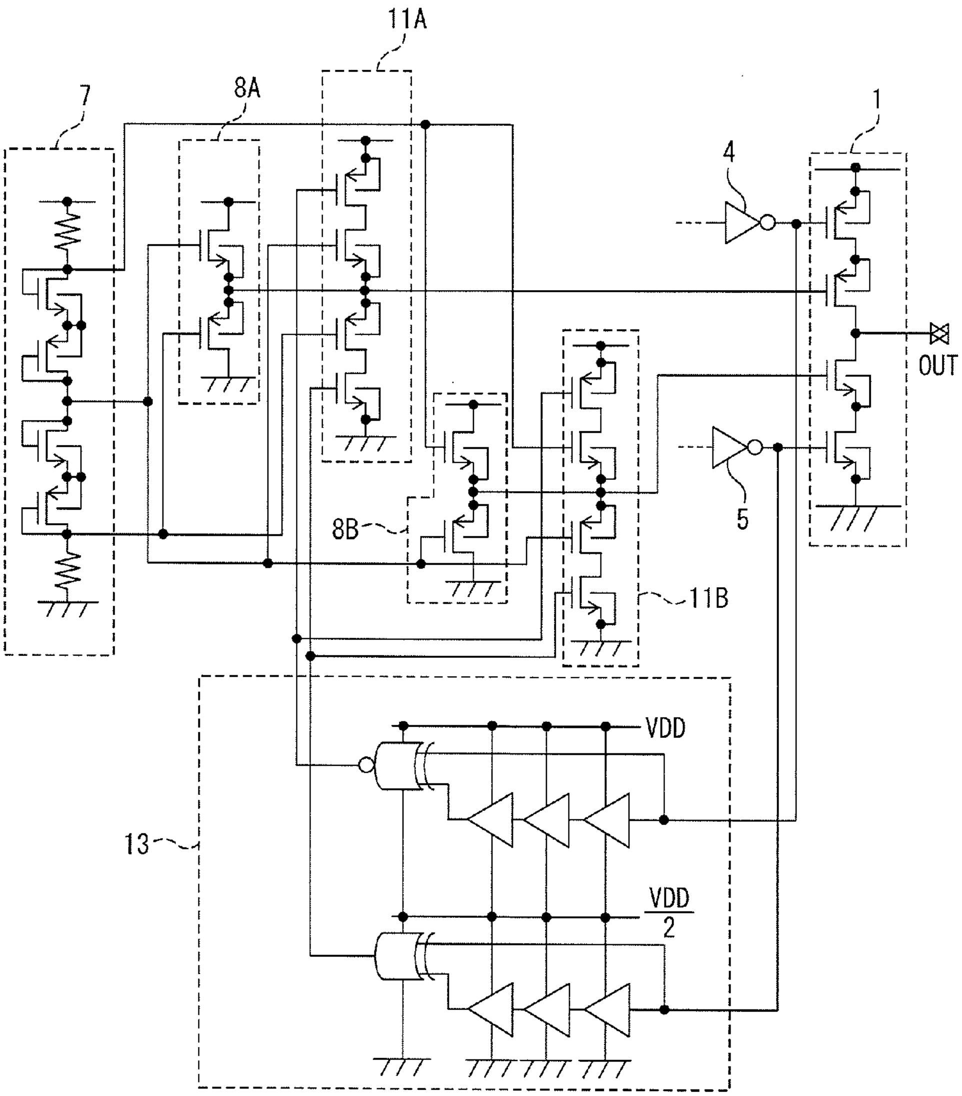
FIG. 6 is a diagram illustrating a configuration of an output circuit of a second embodiment.

FIG. 6 is a diagram illustrating a configuration of an output circuit of a second embodiment.

The output circuit of the second embodiment uses the outputs of the buffers 4 and 5 in the previous stage of the output part 1 for detecting voltage fluctuations at an output terminal OUT.

The output circuit of the second embodiment has a configuration similar to that of the output circuit of the first embodiment, however, differs in that the reentry input is changed to the outputs of the buffers 4 and 5 in the previous stage of the output part 1, and therefore, the reentry input is not provided.

The output of the buffer 4 has a fluctuation range between VDD/2−Vth and VDD and the output of the buffer 5 has a fluctuation range between GND and Vth+VDD/2. Because of this, the output of the buffer 4 is utilized as the input of the first control part of the control circuit 13 as it is, and the output of the buffer 5 is utilized as the input of the second control part of the control circuit 13 as it is.

Different from the first embodiment, in the output circuit of the second embodiment, the first and second bias voltage stabilization circuits 11A and 11B operate only during the time of the output operation, and therefore, they are applied only to the output terminal. However, immediately before the voltage fluctuations at the output terminal OUT, the first and second bias voltage stabilization circuits 11A and 11B are brought into the operating state, and therefore, the responsiveness can be improved compared to the first embodiment. Further, there is an advantage that it is possible to omit the time and effort for providing the inverters 14 and 15 and to prepare and adjust their threshold values each time as in the first embodiment.

Except for the abovementioned point, the operation of the output circuit of the second embodiment is the same as the output circuit of the first embodiment, and therefore, explanation is omitted.

Figure 7:
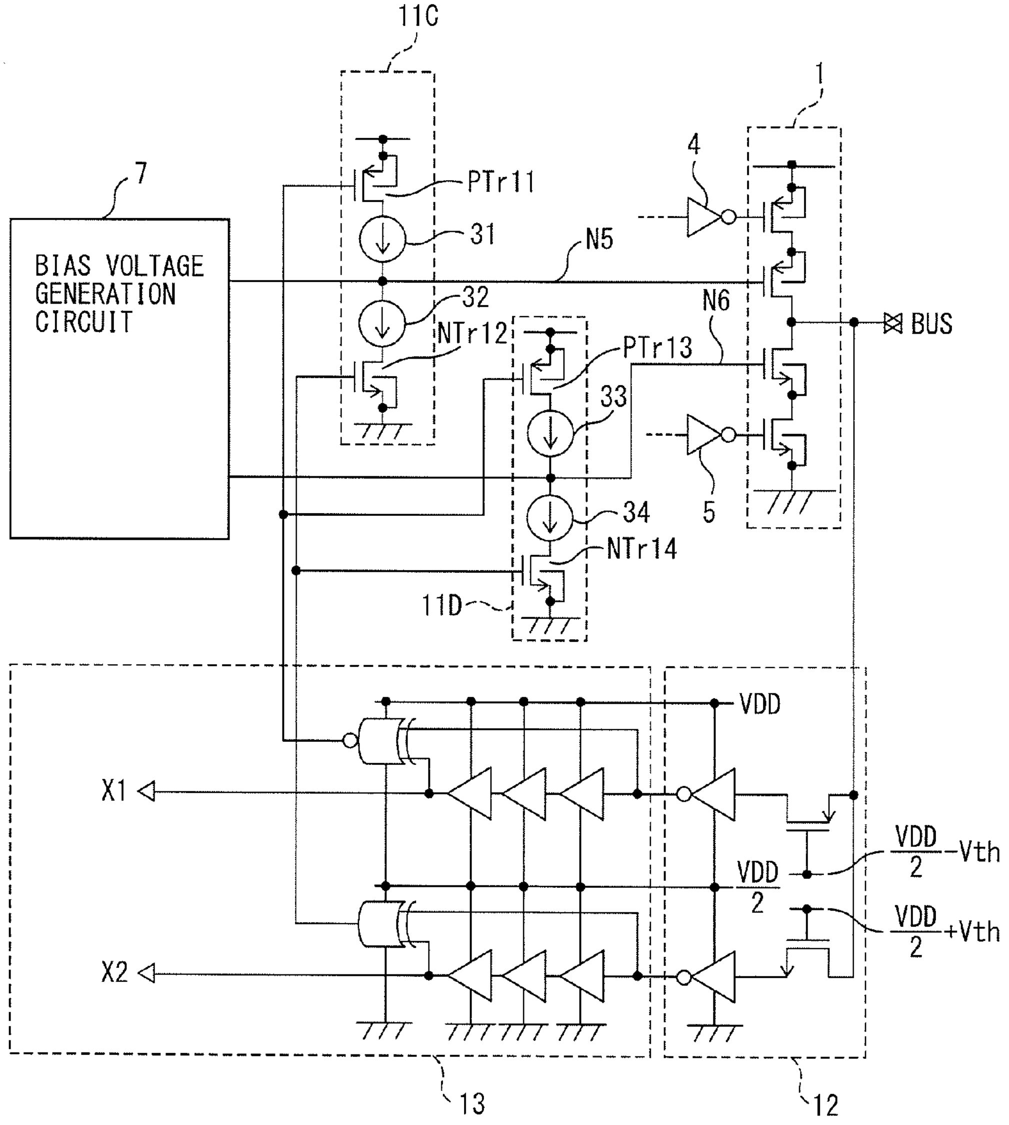
FIG. 7 is a diagram illustrating a concept of a modification example of the output circuit of the first embodiment.

FIG. 7 is a diagram illustrating a concept of a modification example of the output circuit of the first embodiment.

In the output circuit of the first embodiment illustrated in FIG. 4, PTr11, NTr12, PTr13, and NTr14 of the first and second bias voltage stabilization circuits 11A and 11B act as a switch. Further, NTr11, PTr12, NTr13, and PTr14 can be said as a "current source" that acts to supply a current from the VDD power supply or to sink a current to GND when voltage fluctuations occur at the bias nodes N5 and N6. Because of this, it is possible to represent NTr11, PTr12, NTr13, and PTr14 by current sources 31 to 34 as illustrated in FIG. 7.

The operation of the current sources 31 to 34 is the same as that in the first embodiment. In the case where the bias nodes N5 and N6 fluctuate in the positive direction in response to the fluctuations at the terminal BUS caused by a rise signal, NTr12 and NTr14 immediately respond to this and bring the current sources 32 and 34 that draw (sink) a current from N5 and N6 to GND into the operating (active) state. Due to this, the voltage fluctuations at N5 and N6 are suppressed. Conversely, for the fluctuations caused by a fall signal, PTr11 and PTr13 immediately respond and bring the current sources 31 and 33 that supply a current from the VDD power supply to N5 and N6 into the operating (active) state. Due to this, the voltage fluctuations at N5 and N6 are suppressed.

Further, it is possible to represent the voltage divider circuit 7, the first bias voltage output circuit 8A, and the second bias voltage output circuit 8B as the bias voltage generation circuit 6.

In other words, the first and second bias voltage stabilization circuits 11A and 118 may be those the operating state of which is controlled by the first and second control signals by the two current sources, respectively, which supply a current from the VDD power supply or to sink a current to GND. Further, the bias voltage generation circuit 6 may have any configuration in which the voltages at the bias nodes N5 and N6 are maintained in the idle state.

FIG. 7 illustrates a concept of the modification example of the output circuit of the first embodiment, however, there is also a concept of a modification example of the output signal of the second embodiment.

As explained above, in the first and second embodiments, and in the modification examples thereof, the fluctuations that cause the voltage at the bias node to fluctuate are detected using the signal immediately after the reentry input from the buffer or the terminal in the previous stage of the output part. According to the detected fluctuations, the bias voltage stabilization circuit is caused to operate temporarily and thus the voltage fluctuations at the bias node are suppressed.

Due to this, the effect of suppressing the voltage fluctuations at the bias node is improved while suppressing an increase in the constant current to the minimum.

Further, in the output circuit illustrated in FIG. 1 and FIG. 2, in order to suppress the voltage fluctuations that is too large to deal with only by the measures of the bias voltage generation circuit, the bypass capacitor that requires a large area is used auxiliarily. In the first and second embodiments, and in the modification examples thereof also, the bypass capacitor is provided in accordance with the necessity, however, it is possible to considerably reduce the capacitance value. Due to this, it is possible to suppress an increase in the circuit area.

All examples and conditional language provided herein are intended for pedagogical purposes of aiding the reader in understanding the invention and the concepts contributed by the inventor to furthering the art, and are to be construed as limitations to such specifically recited examples and conditions, nor does the organization of such examples in the specification relate to a illustrating of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An output circuit comprising:

a first PMOS transistor and a second PMOS transistor connected in series between a high potential side power supply and an output node, the first PMOS transistor being connected to the side of the high potential side power supply and the second PMOS transistor being connected to the output node side;

a first NMOS transistor and a second NMOS transistor connected in series between a low potential side power supply and the output node, the first NMOS transistor being connected to the side of the low potential side power supply and the second NMOS transistor being connected to the output node side;

a bias voltage generation circuit configured to output a first bias voltage to a first bias node connected to a gate terminal of the second PMOS transistor and to output a second bias voltage to a second bias node connected to a gate terminal of the second NMOS transistor;

a first bias voltage stabilization circuit connected to the first bias node and configured to suppress fluctuations in the first bias voltage;

a second bias voltage stabilization circuit connected to the second bias node and configured to suppress fluctuations in the second bias voltage; and a control circuit configured to detect a change in a signal that fluctuates the first bias voltage and the second bias voltage and to control the operation of the first bias voltage stabilization circuit and the second bias voltage stabilization circuit.

2. The output circuit according to claim 1, wherein the first bias voltage stabilization circuit comprises:

a first current source configured to supply a current from the high potential side power supply to the first bias node;

a second current source configured to sink a current from the first bias node to the low potential side power supply;

a first switch configured to operate the first current source; and a second switch configured to operate the second current source, and the second bias voltage stabilization circuit comprises:

a third current source configured to supply a current from the high potential side power supply to the second bias node;

a fourth current source configured to sink a current from the second bias node to the low potential side power supply;

a third switch configured to operate the third current source; and a fourth switch configured to operate the fourth current source.

3. The output circuit according to claim 2, wherein the first switch is a fifth PMOS transistor one end of which is connected to the high potential side power supply and to the gate of which, a first control signal from the control circuit is applied, the first current source is a fifth NMOS transistor connected between the fifth PMOS transistor and the first bias node and to the gate of which, a first voltage is applied, the second switch is a sixth NMOS transistor one end of which is connected to the low potential side power supply and to the gate of which, a second control signal from the control circuit is applied, the second current source is a sixth PMOS transistor connected between the sixth NMOS transistor and the first bias node and to the gate of which, a second voltage is applied, the third switch is a seventh PMOS transistor one end of which is connected to the high potential side power supply and to the gate of which, a first control signal from the control circuit is applied, the third current source is a seventh NMOS transistor connected between the seventh PMOS transistor and the second bias node and to the gate of which, a third voltage is applied, the fourth switch is an eighth NMOS transistor one end of which is connected to the low potential side power supply and to the gate of which, a second control signal from the control circuit is applied, and the fourth current source is an eighth PMOS transistor connected between the eighth NMOS transistor and the second bias node and to the gate of which, the first voltage is applied.

4. The output circuit according to claim 3, wherein the bias voltage generation circuit comprises:

a voltage divider circuit configured to output the first voltage (central divided voltage), the third voltage (first divided voltage), and the second voltage (second divided voltage);

a first bias voltage output circuit having a third NMOS transistor connected between the high potential side power supply and the first bias node and to the gate of which, the first voltage is applied and a third PMOS transistor connected between the low potential side power supply and the first bias node and to the gate of which, the second voltage is applied, and configured to output the first bias voltage to the first bias node; and a second bias voltage output circuit having a fourth NMOS transistor connected between the high potential side power supply and the second bias node and to the gate of which, the third voltage is applied and a fourth PMOS transistor connected between the low potential side power supply and the second bias node and to the gate of which, the first voltage is applied, and configured to output the second bias voltage to the second bias node.

5. The output circuit according to claim 1, wherein the control circuit comprises:

a first reentry input signal circuit configured to detect voltage fluctuations at the output node and to generate a high level shift fluctuation signal;

a second reentry input signal circuit configured to detect voltage fluctuations at the output node and to generate a low level shift fluctuation signal;

a first control part configured to generate the first control signal in the form of a pulse corresponding to a change edge of the high level shift fluctuation signal; and a second control part configured to generate the second control signal in the form of a pulse corresponding to a change edge of the low level shift fluctuation signal.

6. The output circuit according to claim 4, wherein the control circuit comprises:

a first reentry input signal circuit configured to detect voltage fluctuations at the output node and to generate a high level shift fluctuation signal;

a second reentry input signal circuit configured to detect voltage fluctuations at the output node and to generate a low level shift fluctuation signal;

a first control part configured to generate the first control signal in the form of a pulse corresponding to a change edge of the high level shift fluctuation signal; and a second control part configured to generate the second control signal in the form of a pulse corresponding to a change edge of the low level shift fluctuation signal.

7. The output circuit according to claim 5, wherein the first reentry input signal circuit comprises:

a step-down PMOS transistor; and an inverter that operates on a power supply voltage between the high potential side power supply voltage and an intermediate voltage between the high potential side power supply voltage and the low potential side power supply voltage and the threshold voltage of which is set high, and the second reentry input signal circuit comprises:

a step-down NMOS transistor; and an inverter that operates on a power supply voltage between the intermediate voltage and the low potential side power supply voltage and the threshold voltage of which is set low.

8. The output circuit according to claim 6, wherein the first reentry input signal circuit comprises:

a step-down PMOS transistor; and an inverter that operates on a power supply voltage between the high potential side power supply voltage and an intermediate voltage between the high potential side power supply voltage and the low potential side power supply voltage and the threshold voltage of which is set high, and the second reentry input signal circuit comprises:

a step-down NMOS transistor; and an inverter that operates on a power supply voltage between the intermediate voltage and the low potential side power supply voltage and the threshold voltage of which is set low.

9. The output circuit according to claim 1, wherein the control circuit comprises:

a first control part configured to generate the first control signal in the form of a pulse corresponding to a change edge of a high level shift output signal applied to the gate of the first PMOS transistor; and a second control part configured to generate the second control signal in the form of a pulse corresponding to a change edge of a low level shift output signal applied to the gate of the first NMOS transistor.

10. The output circuit according to claim 4, wherein the control circuit comprises:

a first control part configured to generate the first control signal in the form of a pulse corresponding to a change edge of a high level shift output signal applied to the gate of the first PMOS transistor; and a second control part configured to generate the second control signal in the form of a pulse corresponding to a change edge of a low level shift output signal applied to the gate of the first NMOS transistor.

11. A voltage signal output method for outputting a signal having an amplitude equal to or greater than a withstand voltage of a transistor by applying a first bias voltage to the gate of one PMOS transistor of two PMOS transistors and two NMOS transistors cascode-connected, by applying a second bias voltage to the gate of one of the NMOS transistors, and applying an output signal to the gates of the other one PMOS transistor and the other one NMOS transistor, the method comprising:

detecting a change in signal that fluctuates the first bias voltage and the second bias voltage and generating a first control signal and a second control signal; and making temporarily active a first bias voltage stabilization circuit and a second bias voltage stabilization circuit configured to reduce the impedance between a first bias node that supplies the first bias voltage and a high potential side power supply and the impedance between a second bias node that supplies the second bias voltage and a low potential side power supply in accordance with the first control signal and the second control signal.

* * * * *